United States Patent [19]

Sakamoto et al.

[11] 4,289,981

[45] Sep. 15, 1981

[54] PULSIVE COMPONENT DETECTING APPARATUS

[75] Inventors: Junji Sakamoto, Oota; Hiroyasu Kishi, Gunma, both of Japan

[73] Assignees: Sanyo Electric Co., Ltd., Osaka; Tokyo Sanyo Electric Co., Ltd., Gunma, both of Japan

[21] Appl. No.: 23,408

[22] Filed: Mar. 23, 1979

[30] Foreign Application Priority Data

Jun. 21, 1978 [JP] Japan .............................. 53-75613
Jun. 21, 1978 [JP] Japan .............................. 53-75614
Jul. 5, 1978 [JP] Japan .............................. 53-83277

[51] Int. Cl.$^3$ ...................... H03K 5/153; H03L 5/00

[52] U.S. Cl. .................................. 307/350; 307/363; 307/547; 328/139

[58] Field of Search .............. 307/350, 354, 362, 363, 307/237, 264; 330/254, 258; 328/115, 139; 455/307, 309

[56] References Cited

U.S. PATENT DOCUMENTS 3,005,048 10/1961 Goodrich ...................... 307/363 X
4,124,819 11/1978 Hansen .......................... 307/237 X
4,197,505 4/1980 Nishijima ...................... 307/237 X

*Primary Examiner*—John Zazworsky
*Attorney, Agent, or Firm*—Darby & Darby

[57] ABSTRACT

An input signal including a pulsive noise such as an ignition noise in superposition on a continuous noise such as a white noise is applied commonly to the base electrodes of a pair of transistors of the same conductivity type implementing a differential amplifier. The amplified signal is applied to first and second rectifying circuits for full-wave rectification. The output of the first rectifying circuit is detected by a detecting circuit. The output of the second rectifying circuit is applied to a pulsive noise detecting circuit for detection of a pulsive component. The ratio of the detecting level of the detecting circuit to the detecting level of the pulsive noise detecting circuit is determined for avoiding malfunction of the pulsive component detecting circuit by virtue of the continuous noise.

17 Claims, 9 Drawing Figures

PULSIVE COMPONENT DETECTING APPARATUS

BACKGROUND OF THE INVENTION

1. Field of the Invention

The present invention relates to a circuit for detecting a pulsive component in a signal. More specifically, the present invention relates to an apparatus for detecting a pulsive component for use in a pulsive noise removing apparatus in an FM receiver.

2. Description of the Prior Art

It has been well known that a pulsive noise such as an ignition noise generated by an automobile could interfere with normal reception by an FM receiver. Since such pulsive noise serves to phase modulate the FM signal, the same cannot be removed even by the use of a limiter and hence is transferred to a subsequent stage in the receiver after detection by a detector. Accordingly, it is necessary to remove such pulsive noise in a signal transmission path subsequent to a detector.

Referring to FIG. 1, there is shown a block diagram of an FM radio receiver employing a typical noise removing apparatus where the present invention can be advantageously employed. Referring to FIG. 1, the FM radio receiver shown comprises an antenna 11 for receiving a broadcast FM signal wave, a radio frequency amplifier 12 for amplifying the FM signal received by the antenna 11, a local oscillator 14 for generating a local oscillation signal for the purpose of frequency conversion, a frequency converter 13 for mixing the amplified FM signal from the radio frequency amplifier 12 with the local oscillation signal for converting the frequency of the FM signal into an intermediate frequency, an intermediate frequency amplifier 15 for amplifying the intermediate frequency signal from the frequency converter 13, an FM detector 16 for demodulating the intermediate frequency signal into the original low frequency signal, a stereo demodulating circuit 17 for demodulating the low frequency signal from the FM detector 16 into the original stereo signal, left and right audio frequency amplifiers 18 and 19 for amplifying the demodulated stereo left and right signals, and left and right loud speakers 20 and 21 for converting the amplified left and right audio frequency signals into the left and right sounds. Detailed structure and operation of the various circuits for the respective blocks are well known to those skilled in the art. Hence, it is not believed necessary to describe the same here in more detail.

In the FM stereo receiver shown, the output of the detector 16 is applied through a noise removing circuit 2 to the stereo demodulating circuit 17. The noise removing circuit 2 basically comprises a delay circuit for delaying, say for 3 to 5 microseconds, the output of the detector 16, a gate circuit 4 for gating the signal to remove a noise component from the delayed output of the delay circuit 3 and a store/pilot signal generating circuit 5 connected to receive the output of the gate circuit 4. The noise removing circuit 2 further comprises a high-pass filter 6, a noise detector 7 and a monostable multivibrator 8 for controlling the gate circuit 4. The high-pass filter 6 is designed to detect the energy of a noise component included in the output of the detector 16 and is adapted to pass the signal component of a frequency higher than the audible frequency. The pulse noise detector 7 is designed to detect a pulsive noise in the output of the high-pass filter 6 and is adapted to trigger the monostable multivibrator 8 upon detection of such pulsive noise. The monostable multivibrator 8 provides an output to the gate circuit 4 for a predetermined time period after the same is triggered. Accordingly, the gate circuit 4 is disabled or opened when the output is obtained from the monostable multivibrator 8, thereby to prevent the signal from the delay circuit 3 from being applied to the stereo demodulating circuit 17 for the above described time period. The store/pilot signal generating circuit 5 comprises a capacitor, not shown, for storing the signal level immediately before the gate circuit 4 is opened and a pilot signal generating circuit, not shown, for generating a pseudo pilot signal for use in stereo demodulation.

A detailed structure of one example of such store/pilot signal generating circuit is seen in U.S. Pat. No. 3,739,285, issued June 12, 1973 to United States Philips Corporation and entitled "CIRCUIT ARRANGEMENT FOR SUPPRESSING INTERFERENCES IN AN FM RADIO RECEIVER." Briefly described, the above referenced U.S. Pat. No. 3,739,285 discloses a store/pilot signal generating circuit comprising a capacitor for storing the signal level at a gate circuit and a parallel resonant circuit connected in series with the storing capacitor. In the following the store/pilot signal generating circuit of the above referenced patent will be described in more detail on the assumption that the same is employed in the FIG. 1 FM receiver. The parallel resonance frequency of the parallel resonance circuit is selected to be the frequency of the pilot signal of the FM stereo broadcasting signal, for example, 19 kHz. Accordingly, the signal level immediately before the gate circuit 4 is opened is maintained in the storing capacitor, while the pilot signal necessary for stereo demodulation is obtained from the parallel resonance circuit as a parallel resonance oscillation signal, which is effective for stereo demodulation in the stereo demodulating circuit 17 in the subsequent stage. With such circuit configuration, the gate circuit 4 is opened when a pulsive noise is received, whereby such noise component is prevented from being applied to the stereo demodulating circuit 17 in the subsequent stage. In addition, when the gate circuit 4 is closed, the signal level maintained by the storing capacitor is obtained, whereby the continuity of the signal is established. Accordingly, the referenced patent is effective in the reduction of a pulsive noise. At the same time, the pilot signal necessary for stereo demodulation is not interrupted and thus stereo demodulation during a time period when the gate circuit 4 is opened is not adversely affected. In spite of the above described advantageous features of the store/pilot signal generating circuit disclosed and claimed in the above referenced U.S. Pat. No. 3,739,285, the same also involves the following shortcomings.

More specifically, with the store/pilot signal generating circuit disclosed and claimed in the above referenced U.S. Pat. No. 3,739,285, a series resonance circuit can also be formed by the storing capacitor and the parallel resonance circuit. Formation of such series resonance circuit, however, causes distortion of the signal being applied to the stereo demodulating circuit 17 at such series resonance frequency. Since the frequency causing the above described distortion, i.e. the frequency of the thus formed series resonance circuit is necessarily lower than the resonance frequency of 19 kHz of the parallel resonance circuit and falls in the audible frequency region, distortion is caused in the sound produced from the speakers 20 and 21. In addition, another problem is caused by virtue of the above described series resonance. More specifically, assuming a case where the signal of a frequency commensurate with the frequency of the above described series resonance circuit is obtained when a pulsive noise is incidentally received, then the gate circuit 4 is naturally opened responsive to the pulsive noise and the signal level at that time is stored in the storing capacitor and thereafter the gate circuit 4 is closed when the signal level as stored is obtained. However, the electric charge that has been charged in the capacitor constituting the parallel resonance circuit is discharged at the same time and as a result a much increased noise component is withdrawn from the store/pilot signal generating circuit 5.

On the other hand, on the occasion of no input signal, the pilot signal obtained from the parallel resonance circuit during a time period when the gate circuit 4 is opened becomes a large level, which is then applied to the stereo demodulating circuit 17. Accordingly, the stereo demodulating circuit 17 is placed in a condition wherein proper demodulation of a left signal or a right signal cannot be performed by virtue of the above described continuous large pilot signal and as a result such phenomenon can be heard as a noise from the speakers 20 and 21.

In order to eliminate the above described shortcomings of the above referenced U.S. Pat. No. 3,739,285, a pulsive noise removing apparatus of a totally different principle was proposed in U.S. Pat. No. 4,066,845, issued Jan. 3, 1978 to the same assignee as the present invention and entitled "PULSIVE NOISE REMOVING APPARATUS FOR AN FM RECEIVER." The second referenced U.S. Pat. No. 4,066,845 is directed to a pulsive noise removing apparatus for an FM receiver comprising a bandpass-amplifier for selectively amplifying a signal of the reference frequency such as the pilot signal freqency of 19 kHz or the subcarrier signal frequency of 38 kHz, and an attenuation circuit for attenuating the output of the bandpass-amplifier at the rate commensurate with the gain of the bandpass-amplifier, without employing a parallel resonant circuit, for the purpose of preventing the pilot signal from being interrupted for a time period when the gate circuit 4 is opened, whereby a positive feedback circuit is formed to the bandpass-amplifier by means of a closed loop including the attenuation circuit and the storing capacitor, so that the bandpass-amplifier cooperates with the positive feedback circuit to serve as an oscillator when the gate circuit 4 is opened, whereby the pilot signal or the subcarrier signal is applied to the stereo demodulating circuit 17 without being interrupted. The U.S. Pat. No. 4,066,845 can achieve the same advantageous features as those achieved by U.S. Pat. No. 3,739,285, while U.S. Pat. No. 4,066,845 totally eliminates the above described serious shortcomings involved in U.S. Pat. No. 3,739,285.

Thus, it has been a conventional practice that a pulsive noise is detected and an input signal is interrupted in being applied to a stereo demodulating circuit for a time period of the pulsive noise, whereby a pulsive noise is removed. The present invention is directed to a pulsive component detecting apparatus that can be advantageously employed in the above described conventional pulsive noise removing apparatus. However, the present invention could provide a variety of applications.

In view of the fact that in an FM receiver usually the white noise becomes relatively larger when a signal of a medium or weak intensity electric field is received, a conventional pulsive noise detecting apparatus usually employed in an FM receiver involved a shortcoming that such a relatively larger white noise on the occasion of reception of a signal of medium or weak intensity electric field is erroneously detected as a pulsive noise. It has been observed that such shortcoming becomes more apparent when a quadrature detector suited for implementation in an integrated circuit is employed as has the detector 7. However, the same applies more or less to a well known ratio detector being employed as the detector 7. In order to prevent such malfunction by virtue of a relatively large white noise, one might think of a decrease of the gain of the amplifier included in the pulsive noise detecting apparatus in association with an increase of the white noise level. However, such approach of decreasing the gain of the amplifier entails another shortcoming in that the dynamic range becomes narrow.

SUMMARY OF THE INVENTION

Briefly described, the present invention is directed to an apparatus for detecting a pulsive component in an input signal including a pulsive component in superposition on a continuous component. The input signal is amplified by an amplifying circuit and is applied to a rectifying circuit. The output of the rectifying circuit is applied to a detecting circuit for detecting the level of the continuous component and to a pulsive component detecting circuit for detecting a pulsive component. Means are provided for setting the ratio of the detecting level of the detecting circuit to the detecting level by the pulsive component detecting circuit to a prescribed value.

According to the present invention, the ratio of the level of the continuous component in the input signal to the detecting level for detecting the pulsive component can be set to a ratio value for avoiding malfunction of the pulsive component detecting circuit by virtue of the continuous component. Therefore, malfunction of pulsive component detection by virtue of an increase of the continuous component can be prevented without decreasing the gain of the amplifier.

In a preferred embodiment of the present invention, the detecting level of the pulsive component detecting circuit is controlled responsive to the level of the continuous component, i.e. the output voltage of the detecting circuit. As a result, even a pulsive component of a smaller level as compared with the continuous component can be detected. In a further preferred embodiment of the present invention, an improved biasing circuit of the rectifying circuit is employed, whereby a preferred pulsive component detecting apparatus is provided.

Accordingly, a principal object of the present invention is to provide an improved pulsive component detecting apparatus.

A further object of the present invention is to provide a pulsive component detecting apparatus adapted for avoiding malfunction of pulsive component detection by virtue of a continuous component of an input signal.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
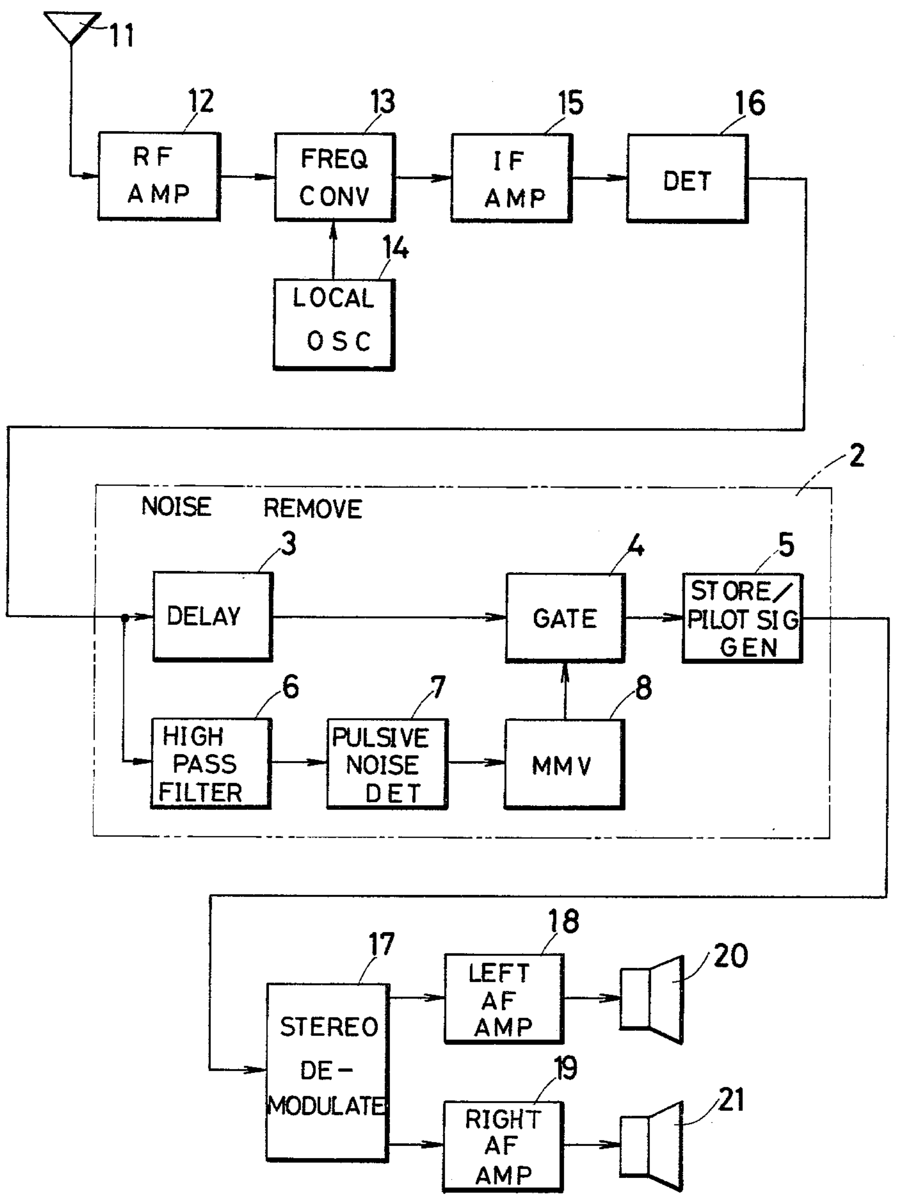
FIG. 1 is a block diagram of one example of an FM stereo receiver employing a typical noise removing apparatus in which the present invention can be advantageously employed.
Figure 2:
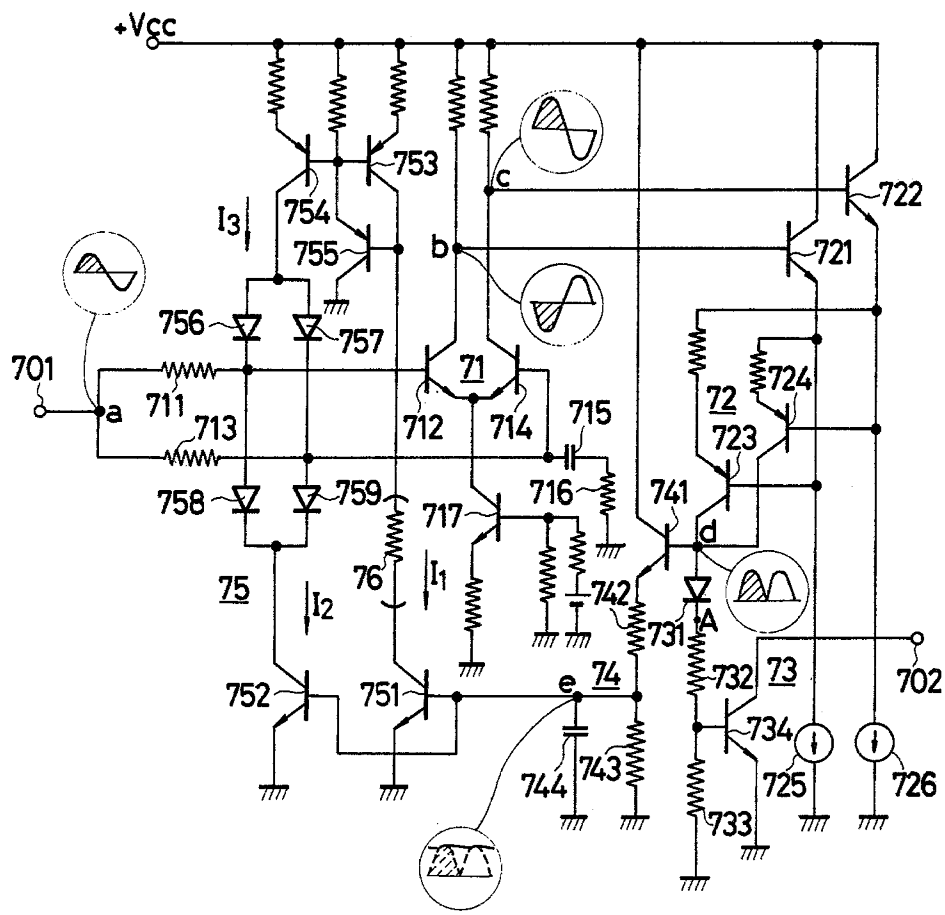
FIG. 2 is a schematic diagram of one embodiment of the present invention.

FIG. 2 shows a schematic diagram of one embodiment of the present invention. A pulsive noise detecting circuit 7 of the embodiment shown comprises a differential amplifier 71 connected to receive a signal from an input terminal 701, a rectifying circuit 72 for rectifying the output of the differential amplifier 71, a pulsive noise detecting circuit 73 for detecting a pulsive noise responsive to the output of the rectifying circuit 72, a detecting circuit 74 for detecting the output of the rectifying circuit 72 and an input limiting circuit 75 for limiting the amplitude of the input of the differential amplifier 71 responsive to the output of the detecting circuit 74. The differential amplifier 71 comprises a pair of NPN transistors 712 and 714 of similar characteristics. The base electrode of each of the pair of transistors 712 and 714 is connected through each of the base resistors 711 and 713 commonly to an input terminal 701 to receive an input signal therefrom. The emitter electrode of each of these two transistors 712 and 714 is commonly connected to a constant current source including a constant current transistor 717. The base electrode of one of the pair of transistors 712 and 714, the transistor 714 in the embodiment shown, is connected through a series connection of a capacitor 715 and a resistor 716 to the ground. The output of the differential amplifier 71, i.e. the collector electrodes of the pair of transistors 712 and 714 are connected to the rectifying circuit 72.

The rectifying circuit 72 is formed to rectify in a full wave manner the output of the differential amplifier 71. The rectifying circuit 72 comprises two rectifying transistors 723 and 724, each of which may comprise a PNP transistor. The base electrode of the transistor 723 is connected to the emitter electrode of the transistor 721 and the emitter electrode of the transistor 721 is connected to the constant current source 725. The base electrode of the transistor 724 is connected to the emitter electrode of the transistor 722 and the emitter electrode of the transistor 722 is connected to the constant current source 726. The emitter electrode of the rectifying transistor 723 is connected through a suitable resistor to the emitter electrode of the transistor 722 and the emitter electrode of the rectifying transistor 724 is connected through a suitable resistor to the emitter electrode of the transistor 721. Accordingly, the transistors 721 and 722 serve to convert the impedance of the output of the differential amplifier 71 so as to determine the operation points of the corresponding rectifying transistors 723 and 724. The output of the rectifying circuit 72, i.e. the collector electrodes of the rectifying transistors 723 and 724 are both connected to the detecting circuit 74 and the pulse detecting circuit 73.

The pulse detecting circuit 73 comprises a diode 731 the anode of which is connected to the output of the rectifying circuit 72. The cathode of the diode 731 is connected to one end of a resistor 732. The other end of the resistor 732 is connected to one end of a resistor 733 and is also connected to the base electrode of the transistor 734. The other end of the resistor 733 is connected to ground. Accordingly, the base bias, i.e. a threshold value of the transistor 734 is determined by the voltage division ratio of the two resistors 732 and 733. The emitter electrode of the transistor 734 is connected to ground and the collector electrode of the transistor 734 is connected to an output terminal 702 of the circuit 7.

The detecting circuit 74 comprises a transistor 741 connected to receive the output of the rectifying circuit 72. The transistor 741 may comprise an NPN transistor, the base electrode of which is connected to the output of the rectifying circuit 72 and the emitter electrode of which is connected to ground through a series connection of resistors 742 and 743. The resistor 743 is shunted by a smoothing capacitor 744. The smoothing capacitor 744 is accordingly charged through the resistor 742 responsive to the output of the detecting transistor 741. The resistor 743 serves as a discharging resistor for the smoothing capacitor 744. The junction of the resistors 742 and 743, i.e. one end of the capacitor 744 is connected to the respective base electrodes of transistors 751 and 752 included in the amplitude limiting circuit 75.

The transistors 751 and 752 of the input limiting circuit 75 may comprise NPN transistors, the emitter electrodes of which are connected to ground. The collector electrode of the transistor 751 is connected to the collector electrode of one of a pair of transistors 753 and 754, i.e. the transistor 753 in the embodiment shown, constituting a current mirror circuit. The pair of transistors 753 and 754 may comprise PNP transistors, the base electrodes of which are commonly connected to the emitter electrode of a transistor 755. The transistor 755 may also comprise a PNP transistor, the base electrode of which is connected to the collector electrode of the transistor 753. The collector electrode of the transistor 754 is connected to the collector electrode of the above described transistor 752 through a diode circuit. The diode circuit comprises four diodes 756, 757, 758 and 759, wherein the diodes 756 and 758 are connected in series while the diodes 757 and 759 are connected in series, these two series connections of diodes being connected in parallel. The cathode of the diode 756 and thus the anode of the diode 758 is connected to the base electrode of one transistor 712 forming the above described differential amplifier 71. Similarly, the cathode of the diode 757 and thus the anode of the diode 759 is connected to the base electrode of the transistor 714.

Since the circuit configuration was described in the foregoing, the operation of the embodiment shown will be described with reference to FIGS. 3 and 4.

For facility of explanation, let it be assumed that a continuous noise component such as a white noise being applied to the input terminal 701 is represented by a sine wave as shown as (a). Further let it be assumed that in an initial condition the smoothing capacitor 744 has not been charged and the first and second control transistors 751 and 752 have been placed in a non-conductive state. Then an input signal applied to the input terminal 701 is applied to the base electrode of one transistor 712 of the differential amplifier 71. On the other hand, the base electrode of the other transistor 714 of the differential amplifier 71 is supplied with an input signal as voltage divided by means of the resistors 713 and 716, because the capacitance of the capacitor 715 is sufficiently large enough to provide a low impedance. Accordingly, the differential of the input signals at the base electrodes of both transistors 712 and 714 is amplified, whereby a signal as shown as (b) is obtained at the collector electrode of one transistor 712 and a signal as shown as (c) is obtained at the collector electrode of the other transistor 714. The signal (b) obtained at the collector electrode of one transistor 712 is subjected to impedance conversion by the first impedance converting transistor 721, while the signal (c) obtained at the collector electrode of the other transistor 714 is subjected to impedance conversion by the second impedance converting transistor 722, whereby the impedance converted outputs are obtained at the emitter electrodes of the respective transistors 721 and 722.

The signals obtained at the emitter electrodes of the first and second impedance converting transistors 721 and 722 are rectified in a full wave manner by means of the transistors 723 and 724 included in the full-wave rectifying circuit 72. More specifically, the base electrode of the first rectifying transistor 723 is connected to the emitter electrode of the first impedance converting transistor 721 and the emitter electrode of the first rectifying transistor 723 is connected to the emitter electrode of the second impedance converting transistor 722. Therefore, the first rectifying transistor 723 becomes conductive during the positive half cycle of the signal (c). Similarly, the second rectifying transistor 724 becomes conductive during the positive half cycle of the signal (b). Since the collector electrodes of the first and second rectifying transistors 723 and 724 are commonly connected, a signal as shown as (d) is obtained at the commonly connected collector electrodes of the transistors 723 and 724 and thus at the output of the rectifying circuit 72.

The smoothing capacitor 744 is charged by the emitter current of the detecting transistor 741. If and when the signal (d) is applied to the base electrode of the transistor 741, the transistor 741 becomes conductive, so that the voltage (e) across the smoothing capacitor 744 varies as shown as (e). If and when the resistance value of the discharging resistor 743 is selected to be sufficiently large as compared with the resistance value of the charging resistor 742, then a peak detected waveform of the signal (d) is obtained at one end of the capacitor 744.

If and when the signal (d) becomes large so that the level of the signal (e) exceeds a predetermined value, i.e. the base-emitter voltage of the transistors 751 and 752, the first and second control transistors 751 and 752 start conducting. Assuming that the collector current of the first control transistor 751 at that time is $I_1$ and the collector current of the second control transistor 752 at that time is $I_2$, then the following equation is obtained:

$$I_1=I_2 \tag{1}$$

When the transistors 751 and 752 become conductive, the four diodes 756, 757, 758 and 759 constituting the diode circuit become conductive. On the other hand, the current mirror circuit is designed such that the same current as the collector current of the transistor 753 flows through the collector electrode of the transistor 754. Accordingly, the collector current of the above described transistor 754 is $I_3$, then the following equation is obtained:

$$I_3=I_1 \tag{2}$$

From the equations (1) and (2), the following equation is obtained:

$$I_3=I_2 \tag{3}$$

The voltage across the smoothing capacitor 744 is restricted by the base-emitter voltage of the first or second control transistor 751 or 752. The above described collector currents $I_1$ and $I_2$ vary in association with the base currents of the first and second control transistors 751 and 752 and accordingly the impedance values of the diodes 756, 757, 758 and 759 vary. Since equation (3) is met at that time, the base bias current of the differential amplifier 71 does not vary by virtue of the current flowing through the above described diodes 756, 757, 758 and 759 and thus the gain of the differential amplifier 71 does not vary.

If and when the input signal (a) becomes large so that the first control transistor 751 becomes conductive, then the impedance of the diodes 756, 757, 758 and 759 decreases and hence the voltage between the base electrodes of both transistors 712 and 714 of the differential amplifier 71 becomes small. Therefore, the signals (b) and (c) become small and as a whole an increase of the above described input signal (a) is suppressed by virtue of a negative feedback operation. Accordingly, the above described signals (b) and (c) are controlled to be constant. Since the above described signals (b) and (c) are controlled to become constant, the signal (d) also becomes constant. Accordingly, a continuous noise of an amplitude large enough as to exceed the detecting level of the pulse noise detecting circuit 73 is prevented from being applied to the base electrode of the detecting transistor 734.

Now the operation of pulsive noise detection will be described in the following. Since a control is achieved such that a continuous noise such as a white noise is controlled to be of a constant level, as described previously, a continuous noise including a pulsive noise as shown at the point A can be shown as shown in FIG. 3. Referring to FIG. 3, a signal having the level approximately at $V_{BE}$ represents a continuous noise and the reference characters P1, P2 and P3 denote pulsive noises.

On the other hand, assuming that the resistance values of the voltage dividing resistors 732 and 733 are R1 and R2 and the signal obtained at the above described point A is $V_A$, then the base voltage $V_B$ of the detecting transistor 734 is expressed by the following equation:

$$V_B=R2(R1+R2)\cdot V_A \tag{4}$$

The detecting transistor 734 becomes conductive if and when the base voltage $V_B$ becomes larger than the base-emitter voltage $V_{BE}$. Now assuming that R1=R2, then the equation (4) may be rewritten as follows:

$$V_B=\tfrac{1}{2}V_A \quad (4')$$

Thus, if and when the voltage $V_A$ becomes larger than the value 2 $V_{BE}$, then the detecting transistor 734 becomes conductive.

Figure 3:
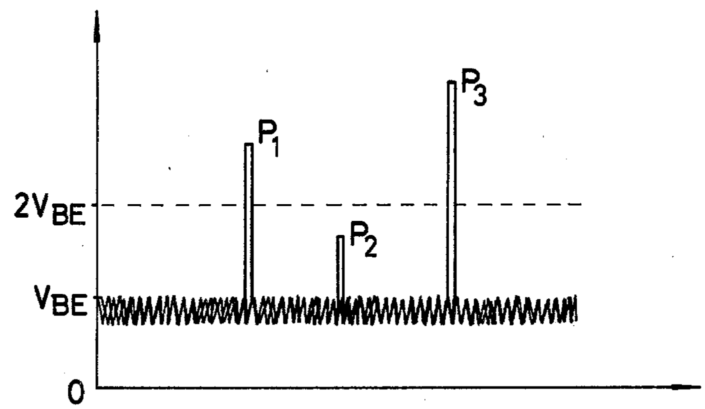
FIG. 3 shows a waveform of one example of the signal obtained at the point A in the FIG. 2 diagram.
Figure 4:
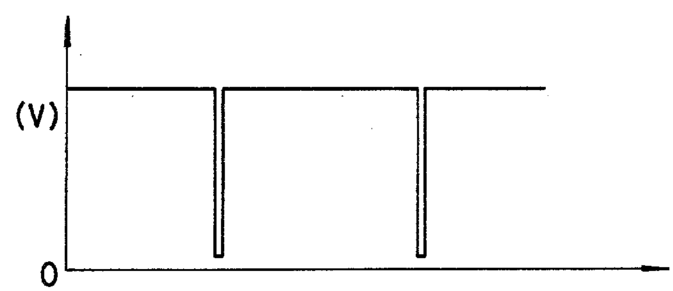
FIG. 4 shows a waveform of a signal obtained at an output terminal of the FIG. 2 diagram in association with the signal shown in FIG. 3.

Accordingly, assuming that a signal as shown in FIG. 3 is applied to the point A, then a signal as shown in FIG. 4 is obtained at the output terminal 702. Pulsive noise detection is thus completed when the signal as shown in FIG. 4 is obtained. Although the pulsive noise P2 does not appear as an output, a pulsive noise of a level similar to that of a continuous noise need not be detected. However, if it is desired that a pulsive noise such as P2 be detected, the same can be detected by changing the voltage division ratio by the voltage dividing resistors 732 and 733. Since a pulsive noise has a small pulse width, the input limiting circuit 75 is very little influenced to be negligible.

As described in the foregoing, the embodiment shown of the inventive pulsive noise detecting circuit brings about the advantages that the level of a continuous noise can be maintained constant and thus the detecting level of a pulsive noise can be maintained constant. The embodiment shown further brings about another advantage that malfunction by virtue of a continuous noise can be prevented by propery setting the above described detecting level and thus the ratio of the resistors 732 and 733. According to the embodiment shown, a further advantage is brought about that since an input signal is controlled in maintaining the continuous noise level constant, a pulsive noise detecting apparatus can be provided wherein the dynamic range of an input is broad and the dynamic range of the output is also broad.

Figure 5:
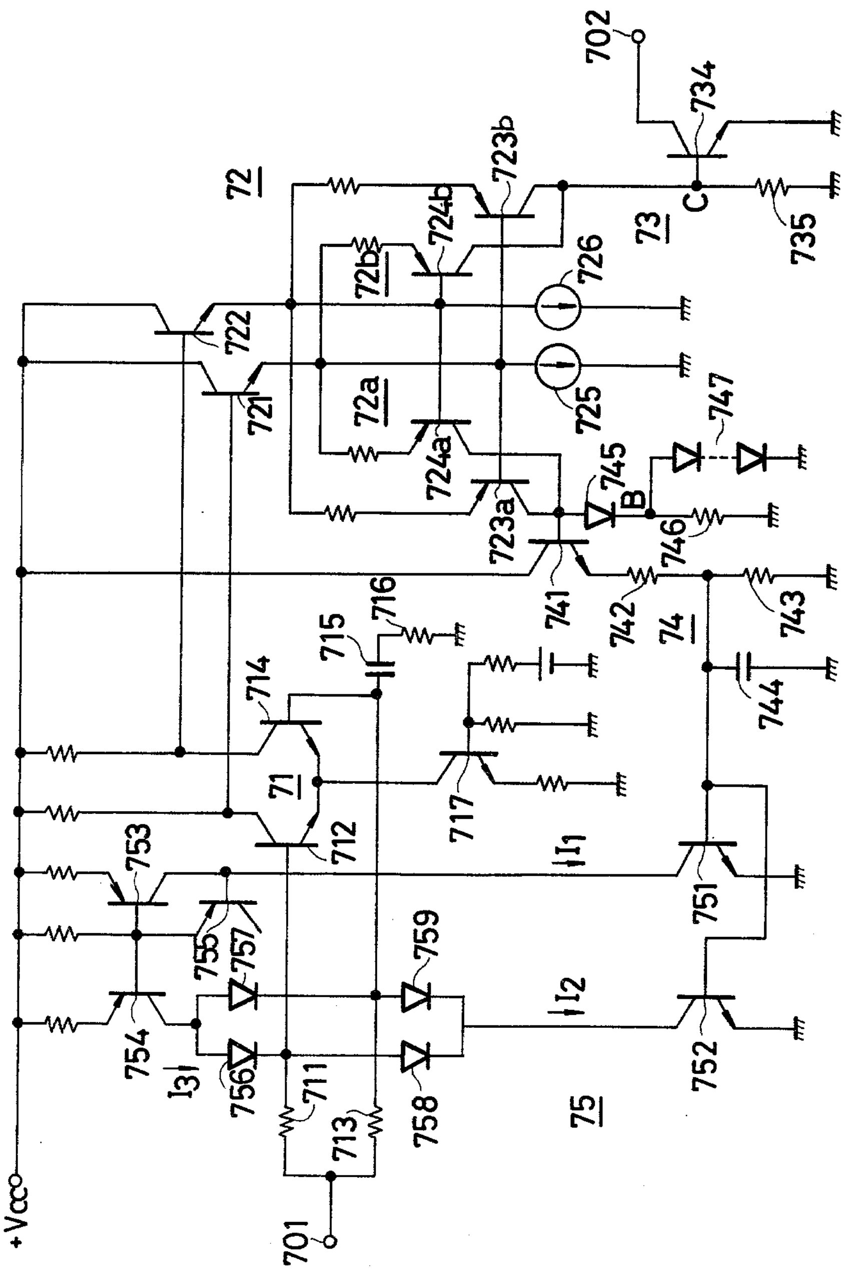
FIGS. 5 and 6 show schematic diagrams of different embodiments of the present invention.

FIG. 5 is a schematic diagram of another embodiment of the present invention. The embodiment shown employs a rectifying circuit 72, a pulsive noise detecting circuit 73 and a detecting circuit 74 of different circuit configurations, as compared with the FIG. 2 embodiment. More specifically, the rectifying circuit 72 comprises two full-wave rectifying circuits **72*a* and 72*b* of the same circuit configuration. The output of one rectifying circuit 72*a* is applied to the detecting circuit 74, while the output of the other rectifying circuit 72*b* is applied to the pulsive component detecting circuit 73. The pulsive noise detecting circuit 73 is responsive to the output of the second rectifying circuit 72*b* to detect a pulsive component from the rectifying circuit 72*b* by means of a detecting transistor 734 at the detecting level determinable by a biasing resistor 735, thereby to provide a detected output to the output terminal 702. The detecting circuit 74 includes a base resistor 746 connected to the base electrode of a detecting transistor 741 and a clipping diode 747 connected in parallel with the base resistor 746**.

According to the FIG. 2 embodiment, as far as the continuous noise level is concerned, the voltage across the smoothing capacitor 744 is controlled to $V_{BE}$, so that the voltage at the point A also becomes $V_{BE}$. On the other hand, the pulsive noise level is concerned, the voltage $V_A$ at the point A when the base voltage of the detecting transistor 734 becomes $V_{BE}$ is the detecting level of the circuit 73 and therefore may be expressed by the following equation:

$$V_A=(R1+R2)/R2\cdot V_{BE} \quad (5)$$

Accordingly, it would be appreciated that in order to prevent malfunction of the pulsive noise detecting circuit 73 by virtue of the continuous noise by increasing the ratio of the detecting level of the continuous noise to the detecting level of the pulsive noise in the FIG. 2 embodiment the resistance value of the resistor 732, i.e. R1 should be increased. However, the larger the resistance value R1 of the resistor 732, the sooner the rectifying transistors 723 and 724 in FIG. 2 become saturated, with the result of possibility that the transistor 734 of the detecting circuit 73 is inoperable in spite of a given pulsive noise.

In view of the above described problem involved in the FIG. 2 embodiment, the FIG. 5 embodiment employs a clipping diode 747 connected to the base electrode of the detecting transistor 741 of the detecting circuit 74.

Now the operation of the FIG. 5 embodiment will be described in the following. First it is pointed out that the first full-wave rectifying circuit **72*a* has the same circuit configuration as that of the full-wave rectifying circuit 72 of the FIG. 2 embodiment and hence performs the same operation. The second full-wave rectifying circuit 72*b* also has the same circuit configuration as that of the first full-wave rectifying circuit 72*a* and performs the same operation. If and when the differential amplifier 71 becomes operable so that the output signal of one transistor 712 becomes larger than the output signal of the other transistor 714, the rectifying transistor 724*a* of the first full-wave rectifying circuit 72*a* and the rectifying transistor 724*b* of the second full-wave rectifying circuit 72*b* both become conductive, whereas if and when the output signal of the other transistor 714 becomes larger than the output signal of one transistor 712, the rectifying transistor 723*a* of the first full-wave rectifying circuit 72*a* and the rectifying transistor 723*b* of the second full-wave rectifying circuit 72*b* become conductive. Accordingly, the same full-wave rectified output signals are obtained at the output terminals of the first and second full-wave rectifying circuits 72*a* and 72*b***.

The output signal of the first full wave rectifying circuit **72*a* is peak detected by means of the detecting transistor 741 and is smoothed by the smoothing capacitor 744. At that time, the pulsive noise in the signal applied to the base electrode of the above described detecting transistor 741 causes little influence against the control signal of the circuit 74 because of the charging time constant of the smoothing capacitor 744. The above described control signal is applied to the base electrode of the first control transistor 751, thereby to render the first control transistor 751 conductive. Conduction of the first control transistor 751 serves to fix the voltage across the smoothing capacitor 744 to $V_{BE}$. Therefore, the level of the continuous noise at the base electrode of the detecting transistor 741 becomes approximately 2 $V_{BE}$. Therefore, the voltage $V_{BW}$ developed with respect to the continuous noise at one end B of the resistor 746 constituting the base circuit of the above described detecting transistor 741** becomes as follows:

$$V_{BW}=V_{BE} \quad (6)$$

On the other hand, the output signal of the second full-wave rectifying circuit 72*b* is applied to the pulsive noise detecting circuit 73. Now assuming that the output currents of the first and second full-wave rectifying circuits 72*a* and 72*b* are the same and are $I_O$, then the voltage BP developed at the point B with respect to the pulsive noise may be expressed by the following equation:

$$V_{BP}=R3\cdot I_0 \quad (7)$$

where R3 is the resistance value of the resistor 746. The voltage $V_C$ at the base electrode of the detecting transistor 734, i.e. the point C may be expressed by the following equation:

$$V_C=R4\cdot I_0 \quad (8)$$

where R4 is the resistance value of resistor 735.

Since the base voltage when the detecting transistor 734 is rendered conductive is $V_{BE}$, the equation (8) may be rewritten as follows:

$$I_0=(1/R4)\cdot V_{BE} \quad (8')$$

From equations (7) and (8'), the following equation is obtained;

$$V_{BP}=(R3/R4)\cdot V_{BE} \quad (9)$$

Accordingly, the level ratio of the continuous noise to the pulsive noise at the point B is obtained from the equations (6) and (9) as follows:

$$V_{BP}/V_{BW}=(R3/R4) \quad (10)$$

Thus it would be appreciated that from the equation (10) an increase of the ratio of the resistor 746 to the resistor 735 increases the detecting level ratio.

As seen from the foregoing description, even according to the above described embodiment, the detecting level ratio can be increased by selecting only the ratio of the resistors 746 and 735. Thus malfunction of the detecting circuit by virtue of the continuous noise can be prevented accordingly.

Nevertheless, there is a possibility that a phenomenon similar to saturation of the rectifying transistors 723 and 724 discussed with reference to FIG. 2 could occur, when the resistance value of the resistor 746 is made too large when too large a detecting level ratio is required for some purpose. Therefore, the embodiment shown has considered this point in that the clipping circuit 747 formed by a series connection of a plurality of diodes is connected in parallel with the resistor 746 for preventing the above described saturation. Because of the above described connection of the clipping circuit 747, a current is caused to flow through the resistor 746 while the current of the first full-wave rectifying circuit 72*a* is small, and after the current becomes large and the clipping circuit 747 becomes operable, the current is caused to flow through the clipping circuit 747. As a result, saturation of the rectifying transistors 723*a* and 724*a* is prevented.

Figure 6:
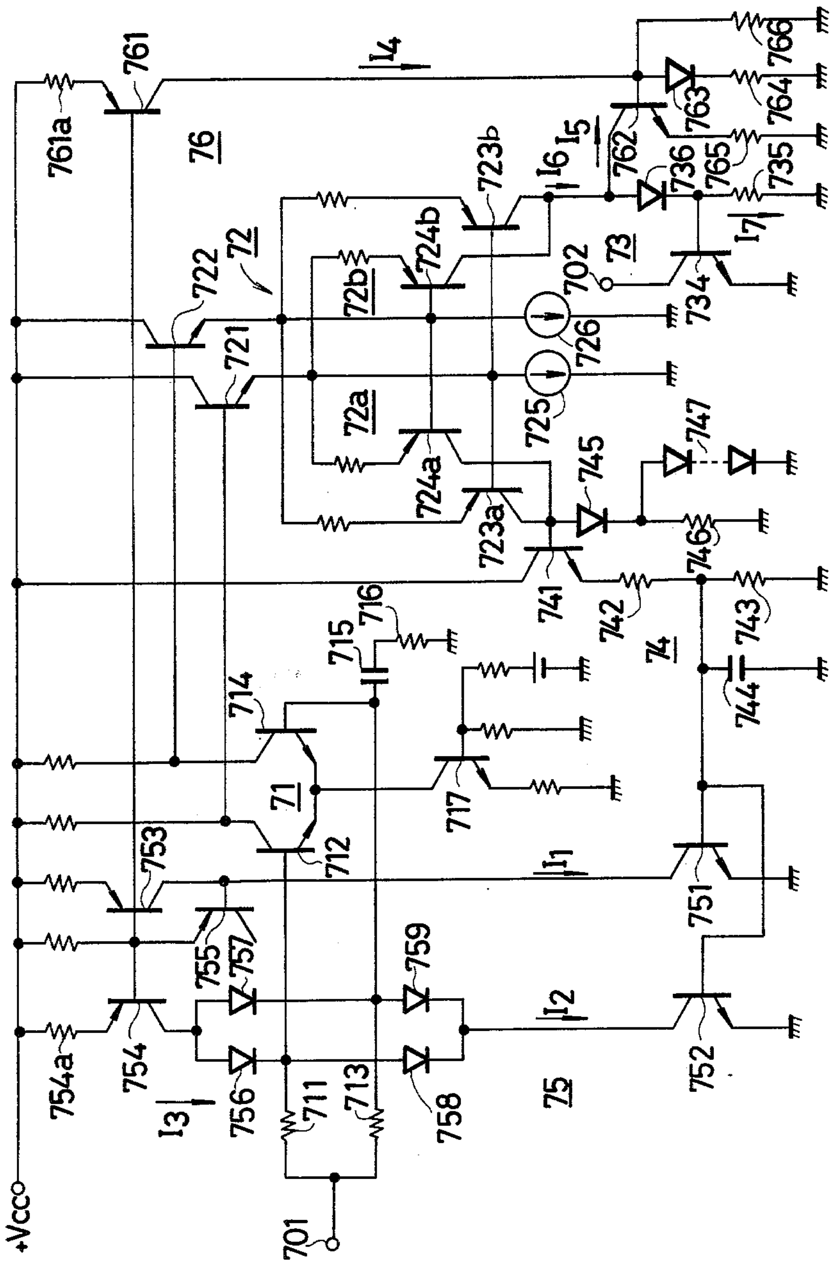

FIG. 6 shows a schematic diagram of another embodiment of the present invention. The embodiment shown is, as compared with the FIG. 5 embodiment, characterized by a pulsive noise detecting circuit 73 and a gain control circuit 76 for controlling the gain of the pulsive noise detecting circuit 73.

In case of the embodiments shown in FIGS. 2 and 5, if and when the detecting level of the pulsive noise is set to the value above the possible maximum level with respect to the continuous noise, then malfunction of the pulsive noise detecting circuit can be prevented. However, this increases the number of pulsive noises that can not be detected and degrades the sensitivity as a pulsive noise detecting circuit. By contrast, according to the embodiment shown, the gain of the pulsive noise detecting circuit is controlled responsive to variation of the level of the continuous noise, whereby an improved pulsive component detecting is provided.

The pulsive noise detecting circuit 73 comprises a diode 736 connected between the base electrode of the detecting transistor 734 and the output terminal of the second rectifying circuit 72*b*. The collector electrode of a bypassing transistor or a gain control transistor 762 for bypassing the signal applied to the base electrode of the detecting transistor 734 is connected to the anode of the diode 736, i.e. the output of the second rectifying circuit 72*b*. The bypassing transistor 762 may comprise an NPN transistor and the emitter electrode of the transistor 762 is connected through an emitter resistor 765 to ground. The base electrode of the transistor 762 is connected to ground through a series connection of a diode 763 and a resistor 764 and is also connected to the collector electrode of a drive transistor 761. The base electrode of the transistor 762 is further connected to ground through a resistor 766. The transistor 761 may comprise a PNP transistor performing the same operation as the pair of transistors 753 and 754 forming the above described current mirror circuit and accordingly the current flowing through the current path of the transistor 761 is the same as the current flowing through the current path of one transistor, say 754, of the pair of transistors.

Now the operation of the embodiment shown will be described in the following. The transistor 761 of the gain control circuit 76 has the same circuit configuration as that of the transistor 754 forming the current mirror circuit. Therefore, the collector current that flows through the transistor 761 is the same as the collector current of the transistor 754. The collector current of the above described transistor 754 flows in response to the control signal applied to the base electrode of the first and second control transistors 751 and 752. Accordingly, the collector current of the drive transistor 761 also flows responsive to the control signal. When the transistor 761 is rendered conductive and collector current flows therethrough, the gain control transistor or the bypassing transistor 762 is rendered conductive in association with the above described collector current. The bypassing transistor 762 and a series connection of the diode 763 and the resistor 764 constitute a current mirror circuit, wherein selection of the resistance values of the resistors 764 and 765 makes the current flowing through the series connection and the collector current of the bypassing transistor 762 the same.

Now assuming that the resistance value of the emitter resistor 754*a* of the transistor 754 of the current mirror circuit and the resistance value of the emitter resistor 761*a* of the transistor 761 are selected to be the same and the collector current of the transistor 754 is $I_3$, then the collector current $I_4$ of the transistor 761 is expressed by the following equation:

$$I_4=I_3 \quad (11)$$

On the other hand, the collector current $I_5$ of the bypassing transistor 762 may be expressed by the following equation:

$$I_5=I_4 \quad (12)$$

Further assuming that the output current of the second full-wave rectifying circuit **72*b* is $I_6$, then the current $I_7$ flowing through the biasing resistor 735 of the detecting transistor 734** may be expressed by the following equation:

$$I_7=I_6-I_5 \quad (13)$$

Further assuming that the resistance value of the above described biasing resistor 735 is R5, then the base voltage $V_{PB}$ of the detecting transistor 734 may be expressed by the following equation:

$$V_{PB}=I_7 \cdot R5 \quad (14)$$

If and when the above described base voltage $V_{PB}$ reaches the base-emitter voltage $V_{BE}$, then the above described detecting transistor 734 is rendered conductive. From the above described equations (11), (12) and (13), the above described equation (14) may be rewritten as follows:

$$V_{PB}=(I_6-I_3) \cdot R5 \quad (14')$$

Since the current $I_3$ varies in accordance with the magnitude of the control signal at the input limiting circuit 75, the voltage $V_{PB}$ expressed by the above described equation (14') also varies in association with the control signal, so that the voltage $V_{PB}$ becomes small when the gain control signal becomes large and becomes large when the gain control signal becomes small.

The above described equation (14') shows that as the continuous noise level increases and the control signal becomes large the pulsive noise detecting level of the detecting transistor 734 becomes accordingly large. Therefore, an advantage is brought about that when the continuous noise level is small the detecting level of the pulsive noise is lowered so that even a small pulsive noise can be detected, whereas when the continuous noise level is large the detecting level of the pulsive noise is raised, so that malfunction by virtue of the continuous noise level can be prevented.

Meanwhile, a charge of the resistance ratio of the emitter resistor **754*a* of the transistor 754 to the emitter resistor 761*a* of the transistor 761 or a change of the resistance ratio of the emitter resistor 765 of the bypassing transistor 762 to the resistors 764 and 766 can change a rate of change of the pulsive noise detecting level responsive to the continuous noise level, which provides an increased freedom of circuit design. At the same time, the fact that the resistor 766 of a suitable resistance value has been connected in parallel with the series connection of the diode 763 and the resistor 764 enables a constant level detection of the pulsive noise within a predetermined range and a variable level detection of the pulsive noise in the range exceeding the above described predetermined range; by properly selecting the resistance value of the above described resistor 766**.

Figure 7:
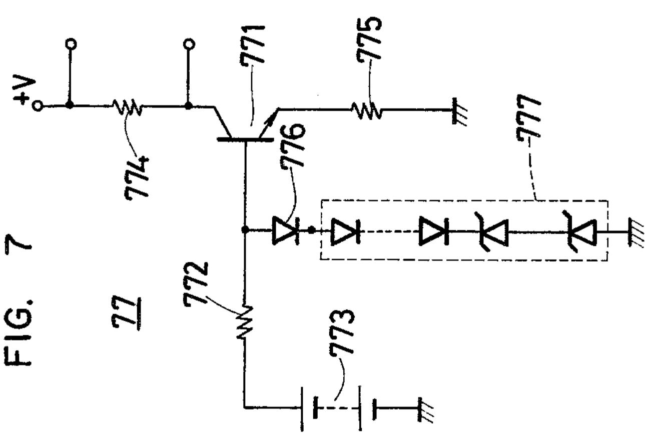
FIG. 7 shows a schematic diagram of one embodiment of the biasing circuit for use in the present invention.

FIG. 7 is a schematic diagram of a preferred embodiment of the biasing circuit for use in the present invention. Referring to FIGS. 2, 5 and 6, it is recalled that the constant current sources 725 and 726 have been employed as a base biasing circuit of the rectifying circuit 72. Generally an integrated circuit employs a biasing circuit for establishing a base bias for amplifying transistors. In such a situation, the base bias requires a voltage commensurate with the voltage $V_{BE}$ of such transistors or a voltage as large as several times the voltage $V_{BE}$ of the transistors. Usually a voltage commensurate with the voltage $V_{BE}$ can be established as a base bias by utilizing the anode-cathode voltage of a diode. However, in case where a voltage as small as a half of the voltage $V_{BE}$ or one-third of the voltage $V_{BE}$ is required as a bias voltage, it was extremely difficult to establish such a bias voltage in accordance with the prior art. Even if such a voltage could be established in accordance with the prior art, a disadvantage was encountered that a predetermined voltage situation becomes imbalanced by virtue of variation of the source voltage, the ambient temperature and the like. As a result, the above described prior art approach for the bias voltage can not provide a desired bias voltage when such variation occurs.

FIG. 7 shows a fundamental principle of a biasing circuit for establishing the base bias of transistors in an integrated circuit. The base bias circuit shown can be particularly advantageously utilized as the constant current sources 725 and 726 of the rectifying circuit 72 in the present invention. Therefore, first of all, such biasing circuit will be described in the following.

The biasing circuit 77 comprises a transistor 771. The base electrode of the transistor 771 is connected through a resistor 772 to a voltage source 773. The base electrode of the transistor 771 is further connected through a series connection of a first diode 776 and a second diode 777 to ground. The second diode 777 serves as a constant voltage element for determining the voltage $V_O$ thereacross. The emitter electrode of the transistor 771 is connected through a resistor 775 to ground. The collector electrode of the transistor 771 is connected through a resistor 774 to the voltage source +V. The voltage developed across the resistor 774 is applied as a base biasing voltage of additional amplifying transistors or rectifying transistors, although not shown in FIG. 7.

The base voltage $V_B$ of the transistor 771 may be expressed by the following equation:

$$V_B=V_O+V_{BE} \quad (15)$$

where $V_{BE}$ is an anode-cathode voltage of the first diode 776.

Assuming that the current flowing through the emitter resistor 775 is $I_E$ and the resistance value of the resistor 775 is Re, then the above described base voltage $V_B$ may be expressed by the following equation:

$$V_B=V_{BE}+Re \cdot I_E \quad (16)$$

Accordingly, from the equations (15) and (16), the emitter current $I_E$ may be expressed by the following equation:

$$I_E=V_O/Re \quad (17)$$

Now assuming that the base current of the transistor 771 is negligible, then the collector current of the transistor 771 becomes equal to the above described emitter current $I_E$. Accordingly, assuming that the resistance value of the collector resistor 774 is Rc, then the voltage $V_{Rc}$ developed thereacross may be expressed by the following equation:

$$V_{Rc}=Rc\cdot I_E=(Rc/Re)V_O \quad (18)$$

Accordingly, it follows that a voltage as large as Rc/Re times the voltage $V_O$ across the second diode, i.e. the constant voltage element 777, is obtained across the collector resistor 774.

The constant voltage element 777 may comprise a series connection of several diodes and several Zener diodes, as shown in FIG. 7. However, the second diode, i.e. the constant voltage element 777 may comprise only a diode or a Zener diode, as necessary.

The biasing circuit shown in FIG. 7 is suited for generating a voltage of $\frac{1}{2}V_{BE}$ across the collector resistor 774 as a base bias voltage. In such a case, the constant voltage element 777 comprises only a single diode and if and when the resistance value Re of the emitter resistor 775 is selected to be as large as two times the resistance value Rc of the collector resistor 774, then the voltage $V_{Rc}$ across the resistor 774 can be selected to be $\frac{1}{2}V_{BE}$.

Figure 8:
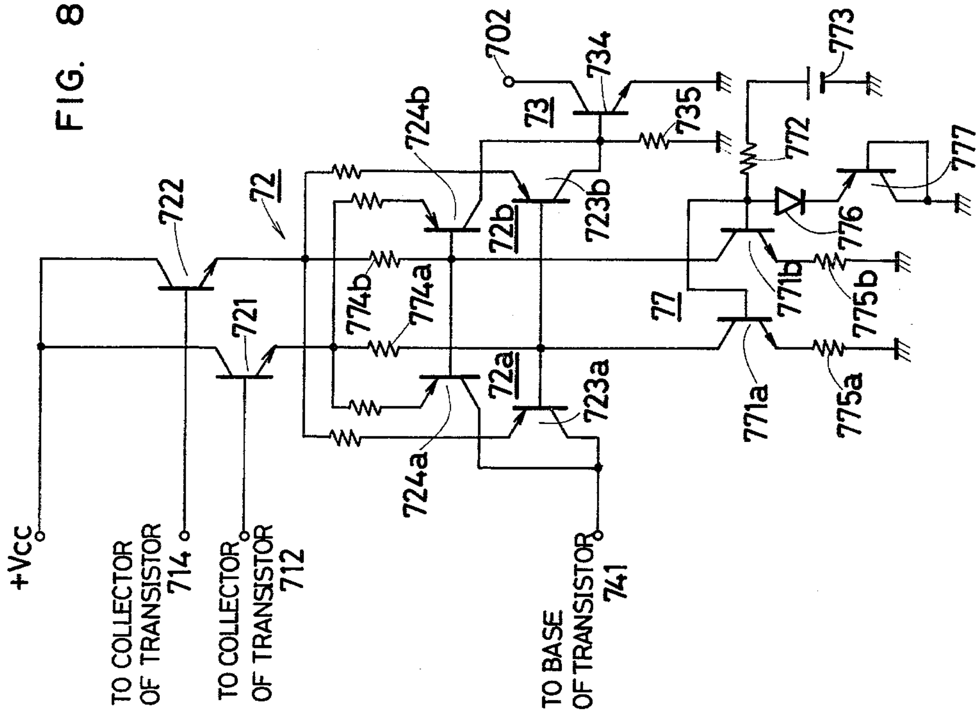
FIG. 8 is a schematic diagram of a major portion of the inventive pulsive component detecting apparatus employing the FIG. 7 biasing circuit.

FIG. 8 shows a schematic diagram of a major portion of the inventive pulsive component detecting apparatus employing the improved biasing circuit 77 described with reference to FIG. 7. The biasing circuit 77 is provided for the purpose of biasing the above described first and second full-wave rectifying circuits 72*a* and 72*b* and comprises transistors 771*a* and 771*b*, a resistor 775*a* connected to the emitter electrode of the transistor 771*a*, a resistor 774*a* connected to the collector electrode of the transistor 771*a*, a resistor 775*b* connected to the emitter electrode of the transistor 771*b*, a resistor 774*b* connected to the collector electrode of the transistor 771*b*, a voltage source 773 for applying a voltage commonly to the base electrodes of the transistors 771*a* and 771*b* through a resistor 772, and a series connection of a first and second diodes 776 and 777 interposed between the above described commonly connected base electrodes and the ground. Assuming that the resistance values of the resistors 775*a* and 775*b* is R6 and the resistance value of the resistors 774*a* and 774*b* is R7, where R6=2R7, then the voltage developed across the resistors 774*a* and 774*b* becomes $\frac{1}{2}V_B$ from the equation (18), where $V_B$ is an anode-cathode voltage of the second diode 777. Further assuming that an emitter current of the first and second impedance converting transistors 721 and 722 on the occasion of no signal is $I_E$ and the collector current of the transistors 771*a* and 771*b* is $I_C$, then $I_E=I_C$. In such situation, the voltage between the base and emitter electrodes of the rectifying transistors 723*a* and 724*a* and the voltage between the base and emitter electrodes of the rectifying transistors 723*b* and 724*b* become $\frac{1}{2}V_{BE}$, respectively, in view of the fact that the emitter voltages of the first and second impedance converting transistors 721 and 722 are equal to each other.

Accordingly, until the emitter voltage of the first impedance converting transistor 721 becomes larger or smaller by $\frac{1}{2}V_{BE}$ than the emitter voltage of the second impedance converting transistor 722, none of the four rectifying transistors 723*a*, 724*b*, 723*b* and 724*b* become conductive, thereby to provide an immunity region of a noise automatic gain control, i.e. the input limiting circuit 75. The above described immunity region can be freely adjusted by merely changing the ratio of the resistance values of the resistors 775*a* and 774*a* or the ratio of the resistance values of the resistors 775*b* and 774*b*.

If and when a difference between the emitter voltage of the first impedance converting transistor 721 and the emitter voltage of the second impedance converting transistor 722 becomes $\frac{1}{2}V_{BE}$, then the rectifying transistors 723*a*, 724*a*, 723*b* and 724*b* become conductive, whereby pulsive noise detection and noise automatic gain control are initiated.

As described in the foregoing, employment of the biasing circuit shown enables easy provision of a voltage much smaller than the voltage of the constant voltage element and particularly provision of $\frac{1}{2}V_{BE}$. As a result, such biasing circuit can be widely applied to any other circuits as well.

Figure 9:
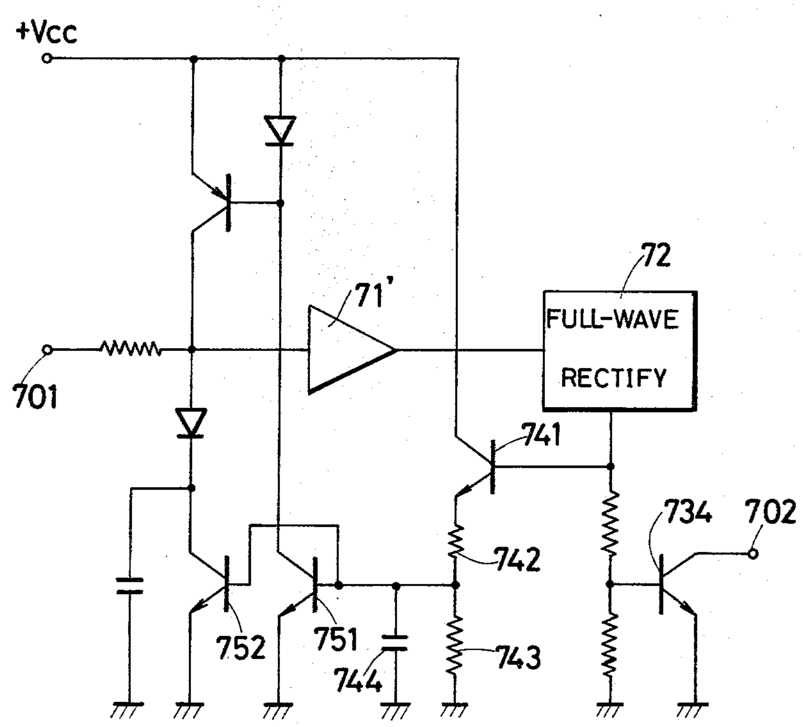
FIG. 9 is a schematic diagram of another embodiment of the amplifier for use in the present invention.

FIG. 9 shows a schematic diagram of another embodiment of the amplifying circuit for use in the present invention. Although in the foregoing embodiments a differential amplifier was employed as the amplifying circuit, an amplifying circuit 71' as shown in FIG. 9 can be utilized as such amplifying circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for detecting a pulsive component in an input signal including a pulsive component in superposition on a continuous component, comprising:
   - amplifying means for amplifying said input signal,
   - rectifying means responsive to the output of said amplifying means for rectifying the output of said amplifying means,
   - detecting means responsive to the output of said rectifying means for detecting at a first detecting level the output of said rectifying means for providing a control signal associated with the level of said continuous component of said input signal,
   - limiting means responsive to said control signal obtained from said detecting means for limiting the amplitude of said input signal being applied to said amplifying means,
   - pulsive component detecting means responsive to the output of said rectifying means for detecting at a second detecting level a pulsive component in said input signal, and
   - level ratio setting means operatively coupled to said detecting means and said pulsive component detecting means for controlling said first and second detecting levels of said detecting means and said pulsive component detecting means, respectively, for avoiding malfunction of said pulsive component detecting means by virtue of said continuous component in said input signal.

2. An apparatus for detecting a pulsive component in accordance with claim 1, wherein
   - said detecting means comprises first detecting transistor means having an input, common and output electrodes, said input electrode of said first detecting transistor means being coupled to the output of said rectifying means,
   - said pulsive component detecting means comprises second detecting transistor means having an input, common and output electrodes, said input electrode of said second detecting transistor means being coupled to the output of the said rectifying means, and said level ratio setting means comprises first resistor means coupled to said input electrode of said first detecting transistor means and second resistor means coupled to said input electrode of said second transistor means, the ratio of the resistance values of said first and second resistor means being selected to set said ratio of said first detecting level and said second detecting level.

3. An apparatus for detecting a pulsive component in accordance with claim 2, which further comprises means responsive to said control signal obtained from said detecting means for controlling said second detecting level of said pulsive component detecting means.

4. An apparatus for detecting a pulsive component in accordance with claim 1, wherein said rectifying means comprises constant current source means.

5. An apparatus for detecting a pulsive component in accordance with claim 4, wherein said constant current source means comprises transistor means having an input, output and common electrodes, first resistor means coupled between said common electrode and the ground and having a resistance value Re, a series connection of a diode and a constant voltage element having a voltage $V_O$ thereacross and being coupled between said input electrode of said transistor means and the ground, second resistor means coupled between said output electrode of said transistor means and having a resistance value Rc, whereby a voltage drop of $(Rc/Re)\cdot V_O$ is developed across said second resistor means.

6. An apparatus for detecting a pulsive component in accordance with claim 1, wherein said rectifying means comprises first and second rectifying circuit means, said first and second rectifying circuit means are connected to commonly receive the output of said amplifying means, said first rectifying circuit means is coupled to provide the output thereof to said detecting means, and said second rectifying circuit means is connected to provide the output thereof to said pulsive component detecting means.

7. An apparatus for detecting a pulsive component in accordance with claim 6, which further comprises detection level control means responsive to said control signal obtained from said detecting means for controlling said second detecting level of said pulsive component detecting means.

8. An apparatus for detecting a pulsive component in accordance with claim 7, wherein said pulsive component detecting means comprises detecting transistor means including an input, output and common electrodes, said input electrode of said detecting transistor means being coupled to the output of said second rectifying circuit means, and level setting circuit means for setting an operation level of said detecting transistor means.

9. An apparatus for detecting a pulsive component in accordance with claim 8, wherein said detecting level control means comprises current supply circuit means for supplying a current in association with said control signal obtained from said detecting means, and control circuit means coupled in parallel with said level setting circuit means for setting an operation level of said detecting transistor means for controlling said operation level in association with the current of said current supply circuit means.

10. An apparatus for detecting a pulsive component in accordance with claim 9, wherein said operation level setting circuit means comprises input electrode biasing resistor means coupled to said input electrode of said detecting transistor means, and said operation level control circuit means comprises bypassing transistor means responsive to the current of said current supply circuit means and being coupled in parallel with said biasing resistor means.

11. An apparatus for detecting a pulsive component in accordance with claim 6, wherein said detecting means comprises first detecting transistor means including an input, output and common electrodes, said input electrode being coupled to the output of said first rectifying circuit means, and said pulsive component detecting means comprises second detecting transistor means including an input, output and common electrodes, said input electrode of said second detecting transistor means being coupled to the output of said second rectifying circuit means.

12. An apparatus for detecting a pulsive component in accordance with claim 11, wherein said level ratio setting means comprises first operation resistor means and second operation resistor means, the ratio of the resistance values of said first and second operation resistor means being selected for setting said ratio of said first and second detecting levels, said first operation resistor means being coupled to said input electrode of said first detecting transistor means and serving as a load resistor of said first rectifying circuit means, and said second operation resistor means being coupled to the input electrode of said second detecting transistor means and serving as a load resistor of said second rectifying circuit means.

13. An apparatus for detecting a pulsive component in accordance with claim 12, which further comprises clipping circuit means coupled in parallel with said first operation resistor means, whereby said first rectifying circuit means is prevented from being saturated by virtue of a pulsive component included in said input signal.

14. An apparatus for detecting a pulsive component in accordance with claim 13, wherein said clipping circuit means comprises one or more diodes.

15. An apparatus for detecting a pulsive component in accordance with claim 6, wherein said first rectifying circuit means comprises first constant current source means, and said second rectifying circuit means comprises second constant current source means.

16. An apparatus for detecting a pulsive component in accordance with claim 15, wherein each of said first and second constant current source means comprises transistor means including an input, output and common electrodes, first resistor means having a resistance value Re and coupled between said common electrode of said transistor and the ground, a series connection including a first diode and a constant voltage element having a voltage $V_O$ thereacross and being coupled between said input electrode of said transistor means and the ground, and second resistor means having a resistance value Rc and being coupled to said output electrode of said transistor means, whereby a voltage drop of $(Rc/Re)\cdot V_O$ is developed across said second resistor means.

17. An apparatus for detecting a pulsive component in accordance with claim 16, wherein said constant voltage element of said series connection comprises a second diode, the ratio of resistance values of said first and second resistor means being selected such that the voltage developed across said second resistor means becomes $\frac{1}{2}V_D$, where $V_D$ is a rise voltage of said second diode.

* * * * *